US012598971B2

(12) United States Patent
Lin et al.

(10) Patent No.: US 12,598,971 B2
(45) Date of Patent: Apr. 7, 2026

(54) CONDUCTIVE VIA WITH IMPROVED GAP FILLING PERFORMANCE

(71) Applicant: Taiwan Semiconductor Manufacturing Company, Ltd., Hsin-Chu (TW)

(72) Inventors: Tzu-Yu Lin, Taoyuan (TW); Yao-Wen Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 699 days.

(21) Appl. No.: 17/895,286

(22) Filed: Aug. 25, 2022

(65) Prior Publication Data

US 2024/0071813 A1    Feb. 29, 2024

(51) Int. Cl.
| | |
|---|---|
| *H01L 21/768* | (2006.01) |
| *H01L 23/522* | (2006.01) |
| *H01L 23/528* | (2006.01) |
| *H01L 23/532* | (2006.01) |
| *H10B 99/00* | (2023.01) |
| *H10D 88/00* | (2025.01) |

(52) U.S. Cl.
CPC .. *H01L 21/76802* (2013.01); *H01L 21/76826* (2013.01); *H01L 21/76843* (2013.01); *H01L 21/76879* (2013.01); *H01L 23/5226* (2013.01); *H01L 23/5283* (2013.01); *H01L 23/53266* (2013.01); *H10B 99/00* (2023.02); *H10D 88/00* (2025.01)

(58) Field of Classification Search
CPC ......... H01L 21/76802; H01L 21/76826; H01L 21/76843; H01L 21/76879; H01L 23/5226; H01L 23/5283; H01L 23/53266; H01L 21/76856; H01L 21/76876; H01L 23/5325; H10B 99/00; H10D 88/00
See application file for complete search history.

(56) References Cited

U.S. PATENT DOCUMENTS

| | | | |
|---|---|---|---|
| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |

(Continued)

FOREIGN PATENT DOCUMENTS

| | | |
|---|---|---|
| TW | 202123402 A | 6/2021 |
| WO | 2013145736 A1 | 10/2013 |

*Primary Examiner* — Julia Slutsker
(74) *Attorney, Agent, or Firm* — HAYNES AND BOONE, LLP

(57) ABSTRACT

A dielectric structure is formed over a layer than contains a conductive component. An opening is formed in the dielectric structure. The opening exposes an upper surface of the conductive component. A first deposition process is performed that deposits a first conductive layer over the dielectric structure and partially in the opening. A treatment process is performed on a first portion of the first conductive layer formed over the dielectric structure. The treatment process introduces a non-metal material to the first portion of the first conductive layer. After the treatment process has been performed, a second deposition process is performed that at least partially fills the opening with a second conductive layer without trapping a gap therein.

20 Claims, 15 Drawing Sheets

(56)          References Cited

U.S. PATENT DOCUMENTS

| | | | |
|---|---|---|---|
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,899,258 B1 * | 2/2018 | Wu | H01L 21/76843 |
| 2014/0001574 A1 | 1/2014 | Chen et al. | |
| 2014/0110755 A1 | 4/2014 | Colinge | |
| 2014/0151812 A1 | 6/2014 | Liaw | |
| 2016/0020142 A1 * | 1/2016 | Chen | H01L 23/5226 |
| | | | 438/654 |
| 2017/0011960 A1 * | 1/2017 | Ko | H01L 21/76843 |
| 2017/0062470 A1 * | 3/2017 | Han | H10B 43/10 |
| 2021/0265265 A1 * | 8/2021 | Kato | H01L 21/76856 |

* cited by examiner

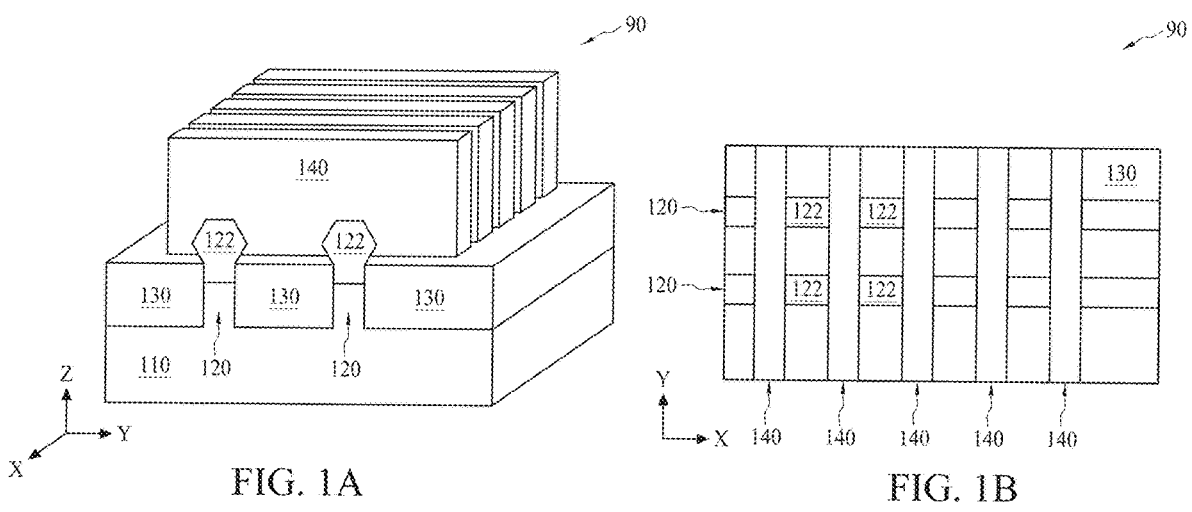
FIG. 1A                    FIG. 1B

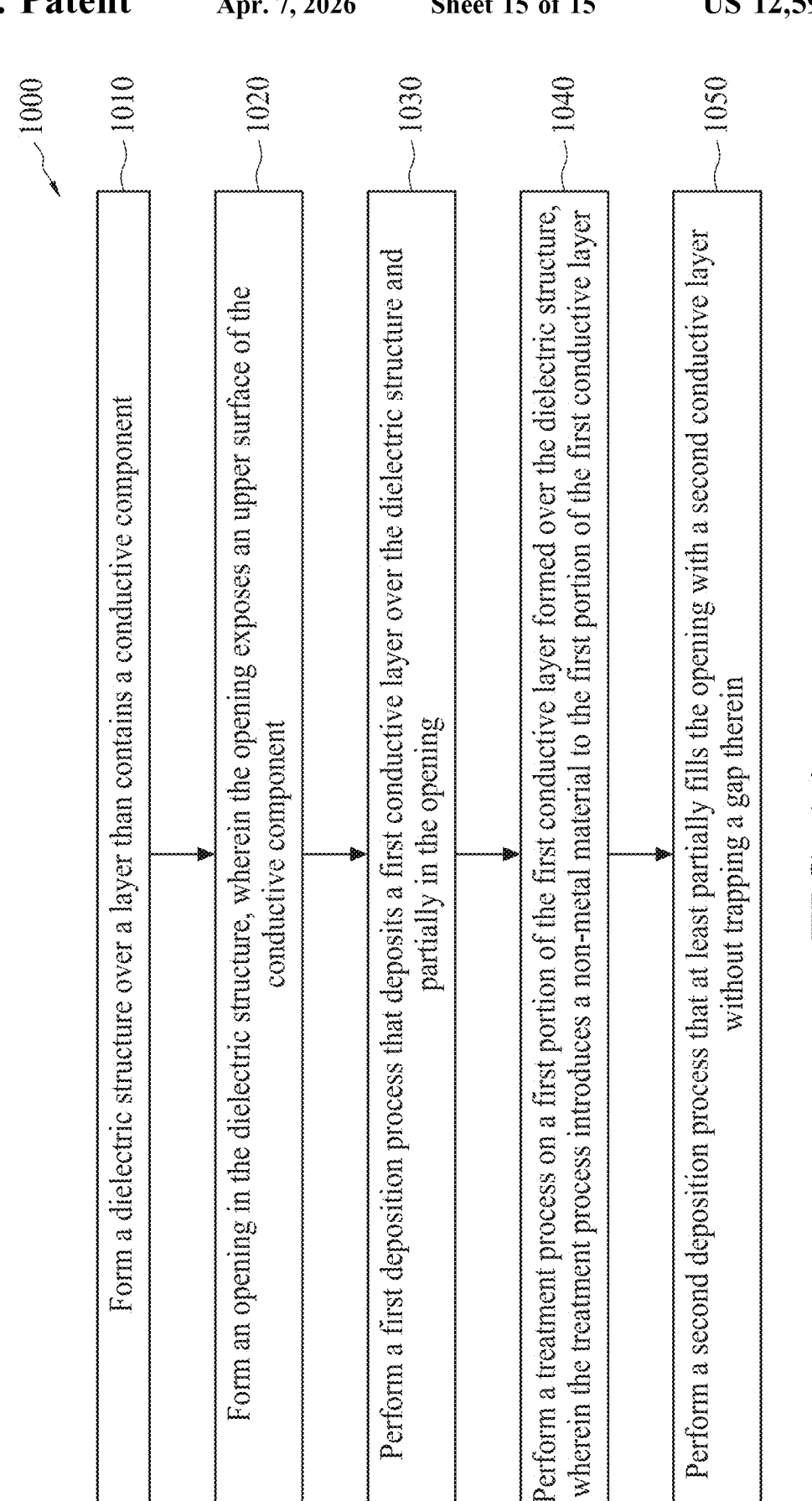

1000

1010 Form a dielectric structure over a layer than contains a conductive component 1020 Form an opening in the dielectric structure, wherein the opening exposes an upper surface of the conductive component 1030 Perform a first deposition process that deposits a first conductive layer over the dielectric structure and partially in the opening 1040 Perform a treatment process on a first portion of the first conductive layer formed over the dielectric structure, wherein the treatment process introduces a non-metal material to the first portion of the first conductive layer 1050 Perform a second deposition process that at least partially fills the opening with a second conductive layer without trapping a gap therein

FIG. 14

CONDUCTIVE VIA WITH IMPROVED GAP FILLING PERFORMANCE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, as the scaling down process continues, it may be more difficult to fabricate certain IC components without performance degradations. For example, a via hole may be etched and subsequently filled to form a conductive via, which is used to electrically interconnect various other IC components together. Unfortunately, as device sizes continue to shrink with each semiconductor technology node, the via hole may become too small to be filled without trapping a seam or a gap therein. When this occurs, the parasitic resistance associated with the conductive via increases, which is undesirable, as it may adversely impact IC performance such as speed or power consumption.

Therefore, although existing semiconductor devices and their method of fabrication have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1A illustrates a three-dimensional perspective view of a FinFET device.

FIG. 1B illustrates a top view of a FinFET device.

FIG. 14 is a flowchart illustrating a method of fabricating a semiconductor device according to various aspects of the present disclosure.

DETAILED DESCRIPTION

Figure 1C:
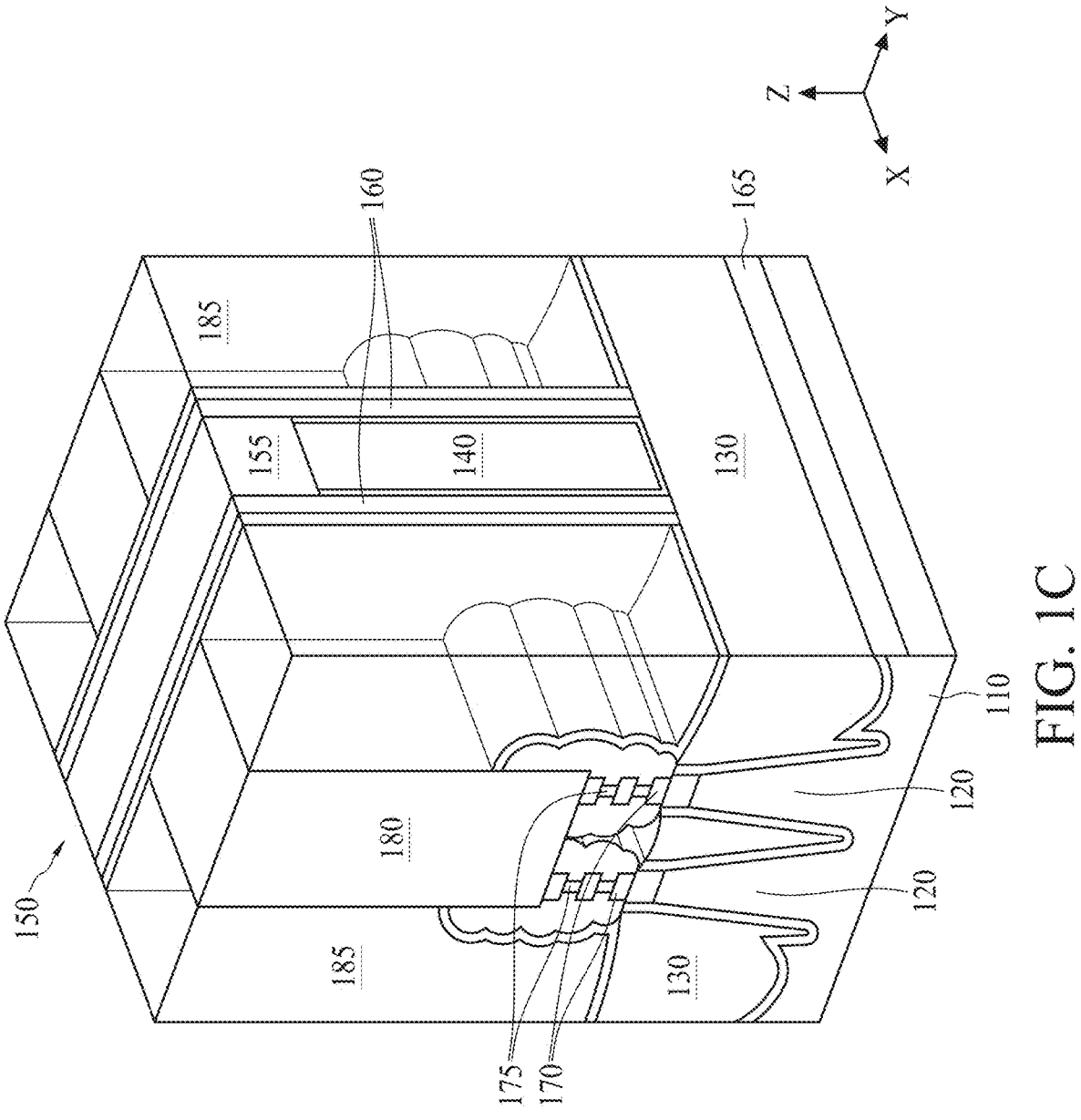
FIG. 1C illustrates a three-dimensional perspective view of a multi-channel gate-all-around (GAA) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to forming vias used in semiconductor devices, which may include field-effect transistors (FETs) such as three-dimensional fin-line FETs (FinFETs) or multi-channel gate-all-around (GAA) devices. FinFET devices have semiconductor fin structures that protrude vertically out of a substrate. The fin structures are active regions, from which source/drain regions and/or channel regions are formed. The gate structures partially wrap around the fin structures. GAA devices have multiple elongated nano-structure channels that may be implemented as nano-tubes, nano-sheets, or nano-wires. In recent years, FinFET devices and GAA devices have gained popularity due to their enhanced performance compared to conventional planar transistors.

As semiconductor device sizes continue to get scaled down, conventional fabrication methods may encounter difficulties. For example, as the device sizes continue to shrink, it may be more difficult to fill a via hole without trapping an air seam or gap therein. Air seams or gaps trapped in the via hole may increase the parasitic resistance of the via, which may slow down the device speed and/or increase the power consumption.

To address the problem discussed above, the present disclosure implements a unique fabrication process flow, in which a deposition process is configured to deposit a conductive layer with an overhang profile at the top portion of the via hole. A treatment process is then performed to introduce a non-metal material to the overhang portion of the conductive material. The overhang portion substantially blocks the treatment from reaching the rest of the conductive layer at the bottom portion of the opening. A selective deposition is then performed to fill the opening with a conductive material to form the via. The non-metal content of the treated overhang portion does not react well with precursors of the selective deposition process, which means the conductive material can be deposited easily on the conductive material within the via hole but not on the overhang portion. In this manner, the via hole can be gradually filled by the conductive material from the bottom toward the top without substantially laterally growing the conductive material at the top of the via hole. Stated differently, such an approach fills the via hole without sealing off the via hole, since the lateral growth of the deposited conductive material is substantially reduced. The resulting via is formed to be free of air seams, gaps, or voids trapped therein. The via may be used in a variety of applications, for example as a bottom electrode via under a memory cell (or another suitable circuit device) embedded in a chip in a three-dimensional integrated circuit (3DIC) according to some embodiments. In other embodiments, the via may be used as a via or a contact in a multilayer interconnect structure.

Figure 10:
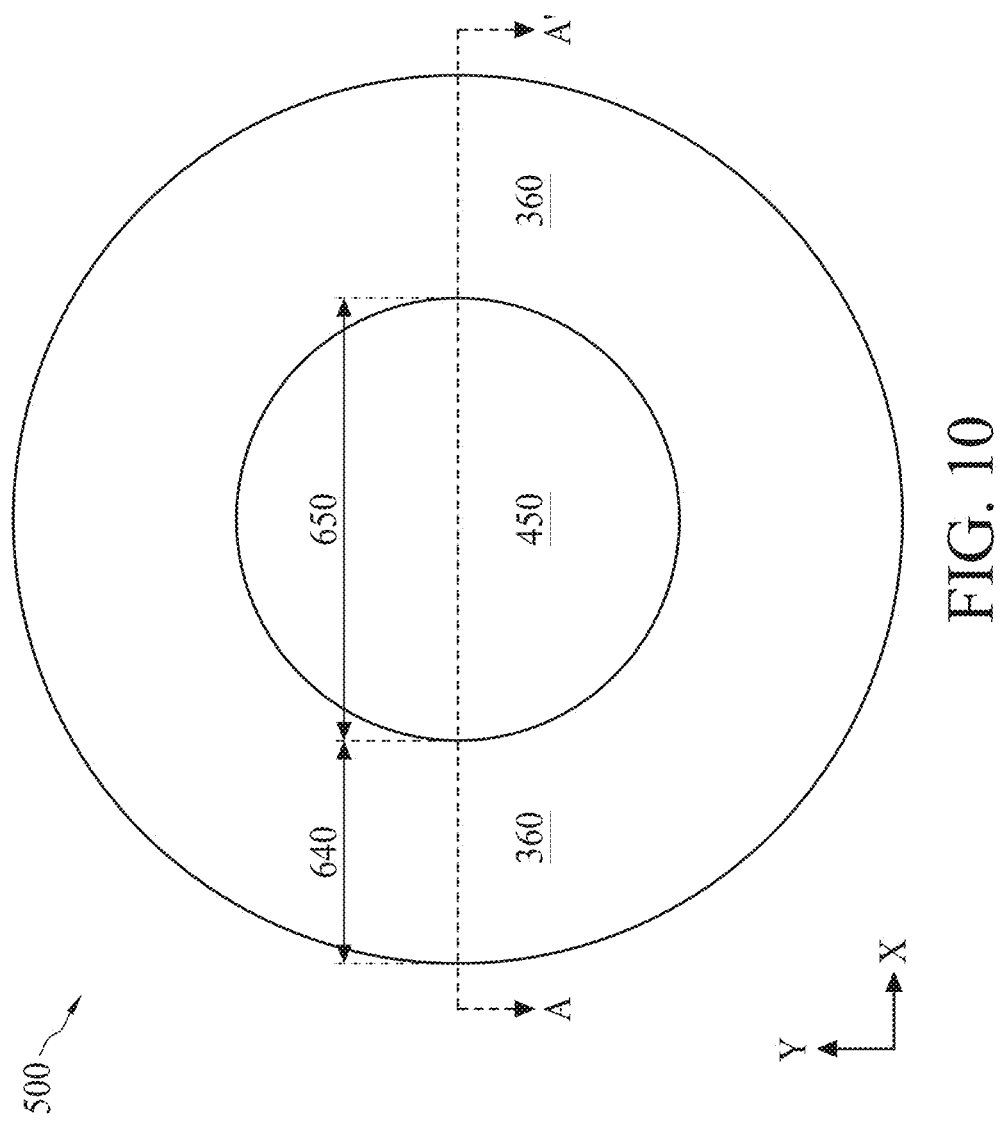
FIG. 10 illustrates a planar top view of a semiconductor device at a stage of fabrication according to embodiments of the present disclosure.
Figure 11:
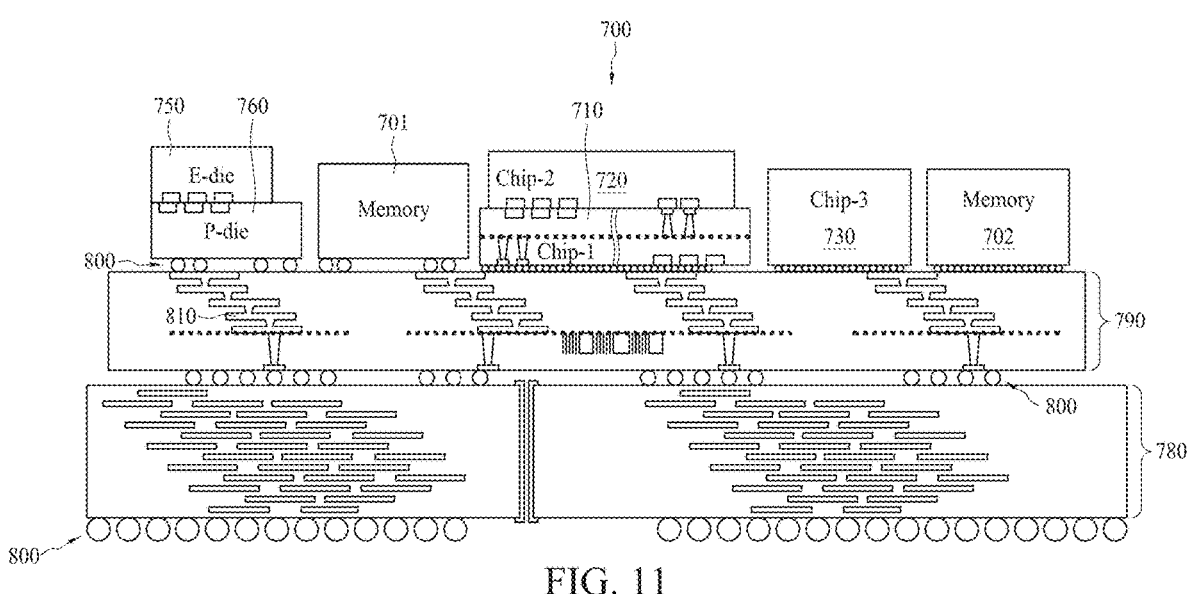
FIG. 11 illustrates a cross-sectional view of a three-dimension integrated circuit (3DIC) device according to embodiments of the present disclosure.

The various aspects of the present disclosure will now be discussed below with reference to FIGS. 1-13. In more detail, FIGS. 1A-B illustrate an example FinFET device, and FIG. 1C illustrates an example GAA device. FIGS. 2-9 illustrate cross-sectional side views of an IC device at various stages of fabrication according to embodiments of the present disclosure. FIG. 10 illustrates a top view of a via according to an embodiment of the present disclosure. FIG. 11 illustrates a cross-sectional view of a 3DIC. FIGS. 12A, 12B, 12C, and 12D illustrate cross-sectional views of various embodiments of a circuit according to various aspects of the present disclosure. FIG. 13 illustrates a semiconductor fabrication system. FIG. 14 illustrates a flowchart of a method of fabricating an IC device according to various aspects of the present disclosure.

Referring now to FIGS. 1A and 1B, a three-dimensional perspective view and a top view of a portion of an Integrated Circuit (IC) device 90 are illustrated, respectively. The IC device 90 is implemented using FinFETs. As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain components 122 formed over the fin structures 120. The source/drain components 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be High-k metal gate (HKMG) structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structure 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 is disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180. The ILD 185 may be referred to as an ILD0 layer. In some embodiments, the ILD 185 may include silicon oxide, silicon nitride, or a low-k dielectric material.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

The FinFET devices and GAA devices may be electrically interconnected using metallization components such as metal lines and conductive vias/contacts. According to the various aspects of the present disclosure, a unique fabrication process flow is performed to form such a via that could be used to provide electrical access to the FinFET devices or GAA devices, as discussed below.

Figure 2:
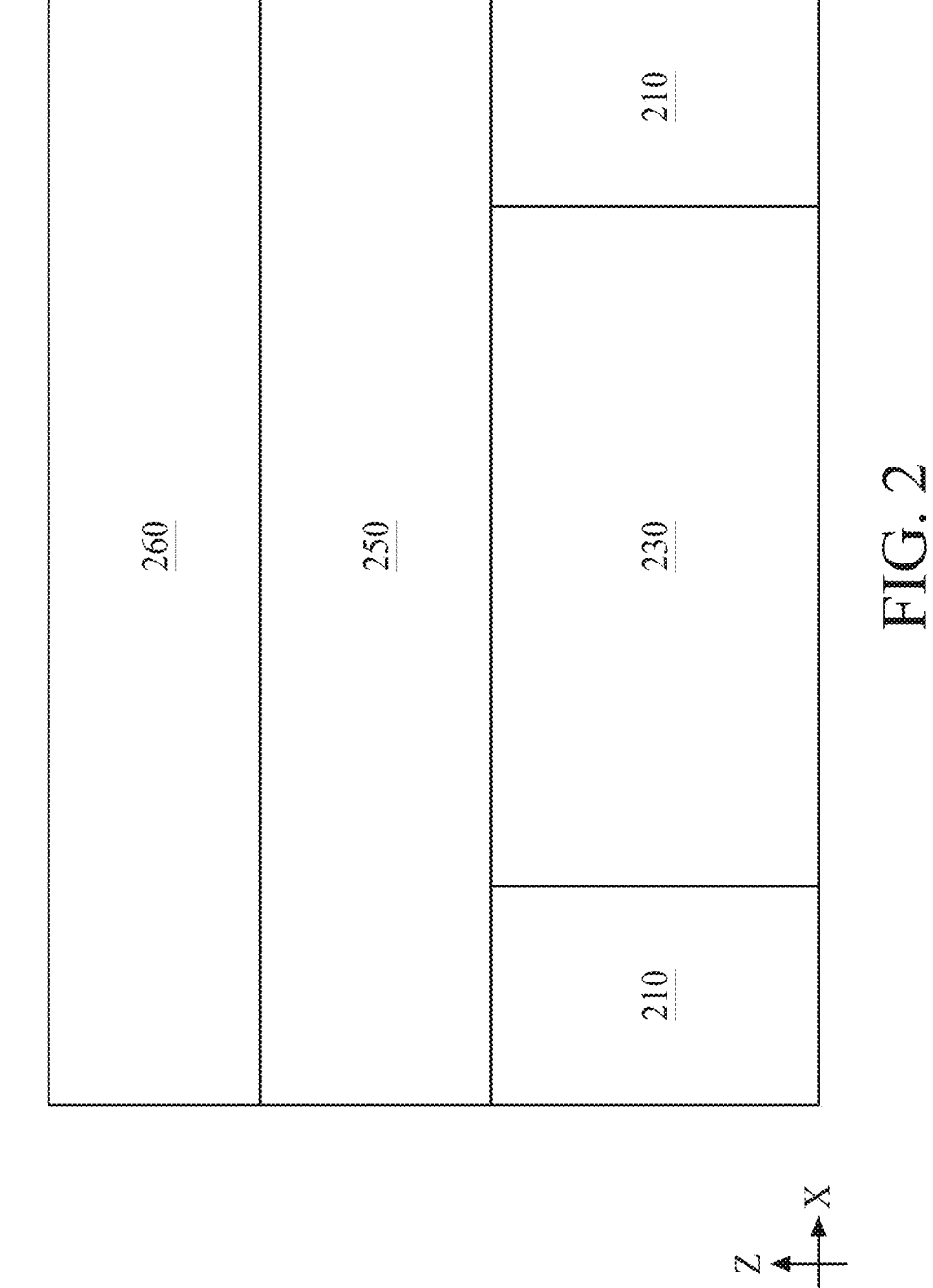
FIGS. 2-9 illustrate a series of cross-sectional views of a semiconductor device at various stages of fabrication according to embodiments of the present disclosure.

FIGS. 2-9 illustrate diagrammatic fragmentary cross-sectional views of a portion of an IC device 200 at various stages of fabrication according to various embodiments of the present disclosure. In more detail, FIGS. 2-9 illustrate the cross-sectional views along an X-Z plane, and as such, FIGS. 2-9 may be referred to as X-cuts. As shown in FIG. 2, the IC device 200 includes a layer 210. The layer 210 may be formed over a variety of microelectronic components. For example, the layer 210 may be formed over the substrate 110 discussed above, which may comprise an elementary (single element) semiconductor, a compound semiconductor, an alloy semiconductor, and/or other suitable materials. As another example, the layer 210 may be formed over a metallization component, such as via or a contact, of a multilayer interconnect structure. As yet another example, the layer 210 may be formed over a transistor component, such as over a gate component, a source component, or over a drain component. For reasons of simplicity, the layer(s) underneath the layer 210 are not illustrated in FIG. 2.

In some embodiments, the layer 210 includes a dielectric material, for example, silicon oxide, silicon nitride, silicon oxynitride, etc. The layer 210 contains a conductive component 230. Alternatively stated, the conductive component 230 is embedded in the layer 210. The conductive component 230 may be a metal line or another suitable metallization component of a multilayer interconnect structure. In some embodiments, the conductive component 230 includes copper, aluminum, cobalt, ruthenium, tungsten, titanium, or combinations thereof.

A layer 250 is formed over the layer 210, including over the conductive component 230. The layer 250 may be formed using a chemical vapor deposition (CVD) process, a physical vapor deposition (PVD) process, an atomic layer deposition (ALD) process, or combinations thereof. In some embodiments, the layer 250 includes silicon carbide (SiC). The layer 250 may serve as an etching stop layer in some embodiments.

A layer 260 is formed over the layer 250. The layer 250 may also be formed using a CVD process, a PVD process, an ALD process, or combinations thereof. In some embodiments, the layer 260 includes a silicon-rich oxide (SRO). For example, the silicon content in the layer 260 may be greater than the silicon content in $SiO_2$. The layers 250 and 260 may be collectively referred to as a dielectric structure.

Figure 3:
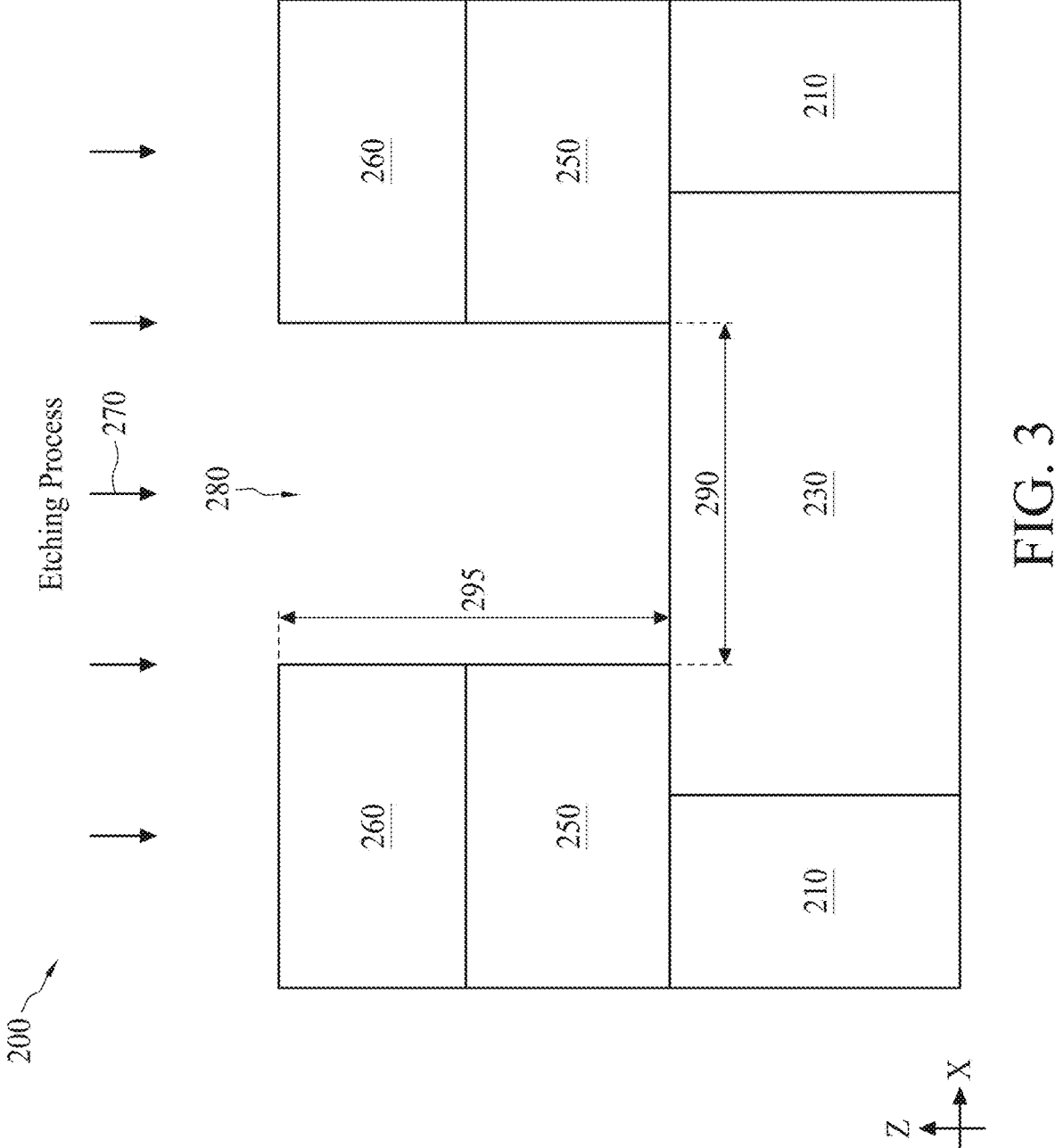

Referring now to FIG. 3, an etching process 270 is performed to the IC device 200 to etch an opening 280 that extends vertically (in the Z-direction) through the layers 250 and 260, such that a portion of an upper surface of the conductive component 230 is exposed by the opening 280. The etching process 270 may include a wet etching process in some embodiments or a dry etching process in other embodiments. As will be discussed below, the opening 280 will be filled by a conductive material, so that the conductive material filling the opening 280 may serve as a conductive via. As such, the opening 280 may be referred to as a via hole 280 interchangeably hereinafter.

The opening 280 may have a lateral dimension 290 (measured in the X-direction), which may also be interchangeably referred to as its critical dimension (CD). In some embodiments, the lateral dimension 290 is in a range between about 40 and about 200 nanometers. The opening 280 also has a vertical dimension 295 (measured in the Y-direction), which may also be interchangeably referred to a depth of the opening 280. In some embodiments, the vertical dimension is in a range between about 80 and about 400 nanometers. An aspect ratio of the lateral dimension 290 and the vertical dimension 295 is in a range between about 1:1 and about 1:2. The above ranges are not randomly chosen but rather specifically configured to facilitate the following processes. For example, if the dimensions or the aspect ratio of the opening 280 are outside of the ranges discussed above, it may be difficult to form an overhang feature (discussed below in more detail) in the opening 280, and/or it may be difficult to fill the opening 280 with or without implementing the fabrication process flow of the present disclosure.

Figure 4:
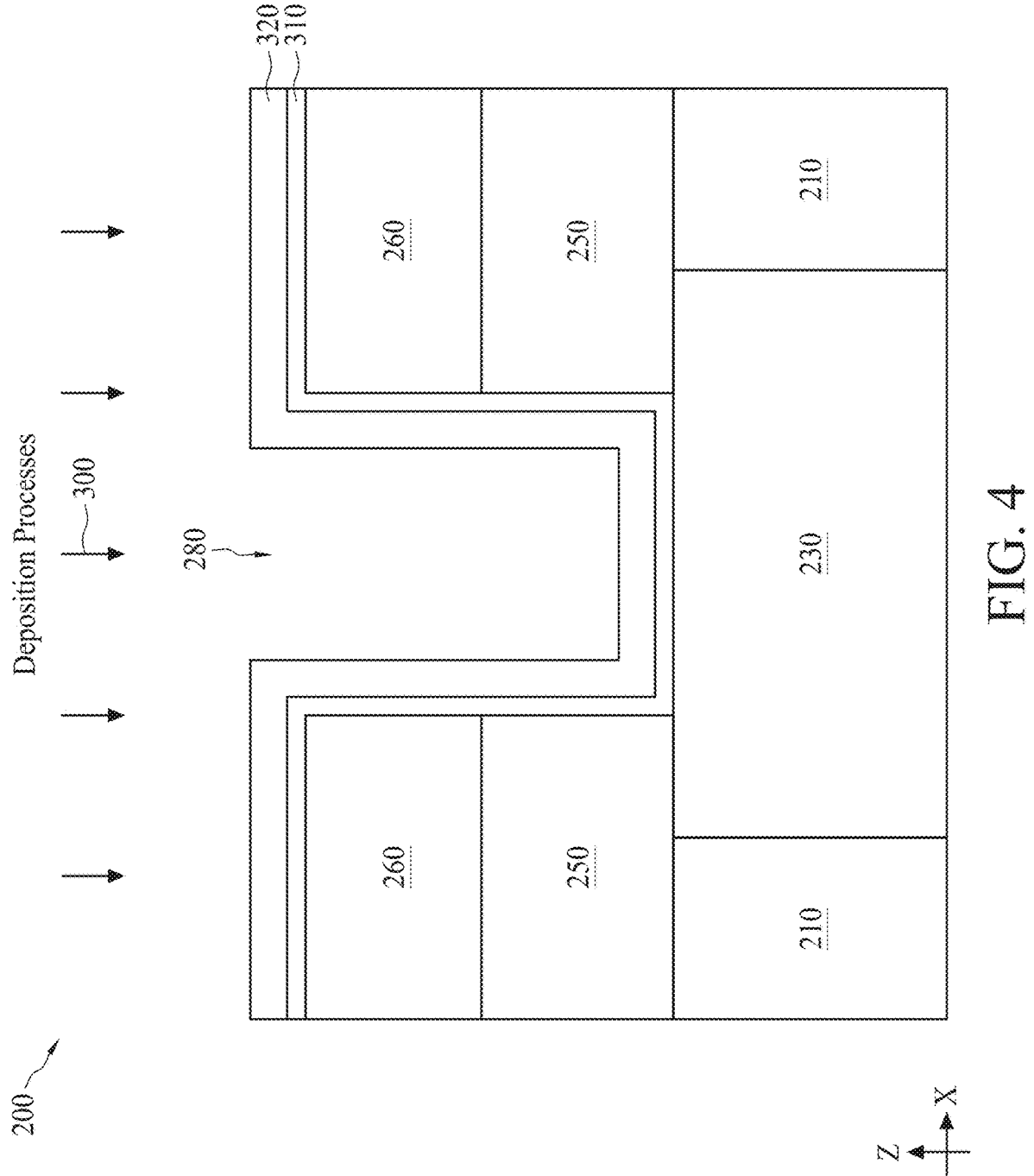

Referring now to FIG. 4, a plurality of deposition processes 300 are performed to the IC device 200 to form a barrier layer 310 and a glue layer 320. The deposition processes 300 may include CVD processes, PVD processes, ALD processes, or combinations thereof. The barrier layer 310 is deposited partially in the opening 280, such that the barrier layer 310 is deposited on the exposed upper surface of the conductive component 230 and on sidewalls of the layers 250 and 260. The barrier layer 310 is also deposited on the upper surface of the layer 260. The glue layer 320 is then deposited on the surfaces of the barrier layer 310. In some embodiments, the barrier layer 310 includes a conductive material, such as copper. In some embodiments, the glue layer 320 includes titanium nitride (TiN). The glue layer 320 enhances the adhesion of a layer to be formed thereon.

Figure 5:
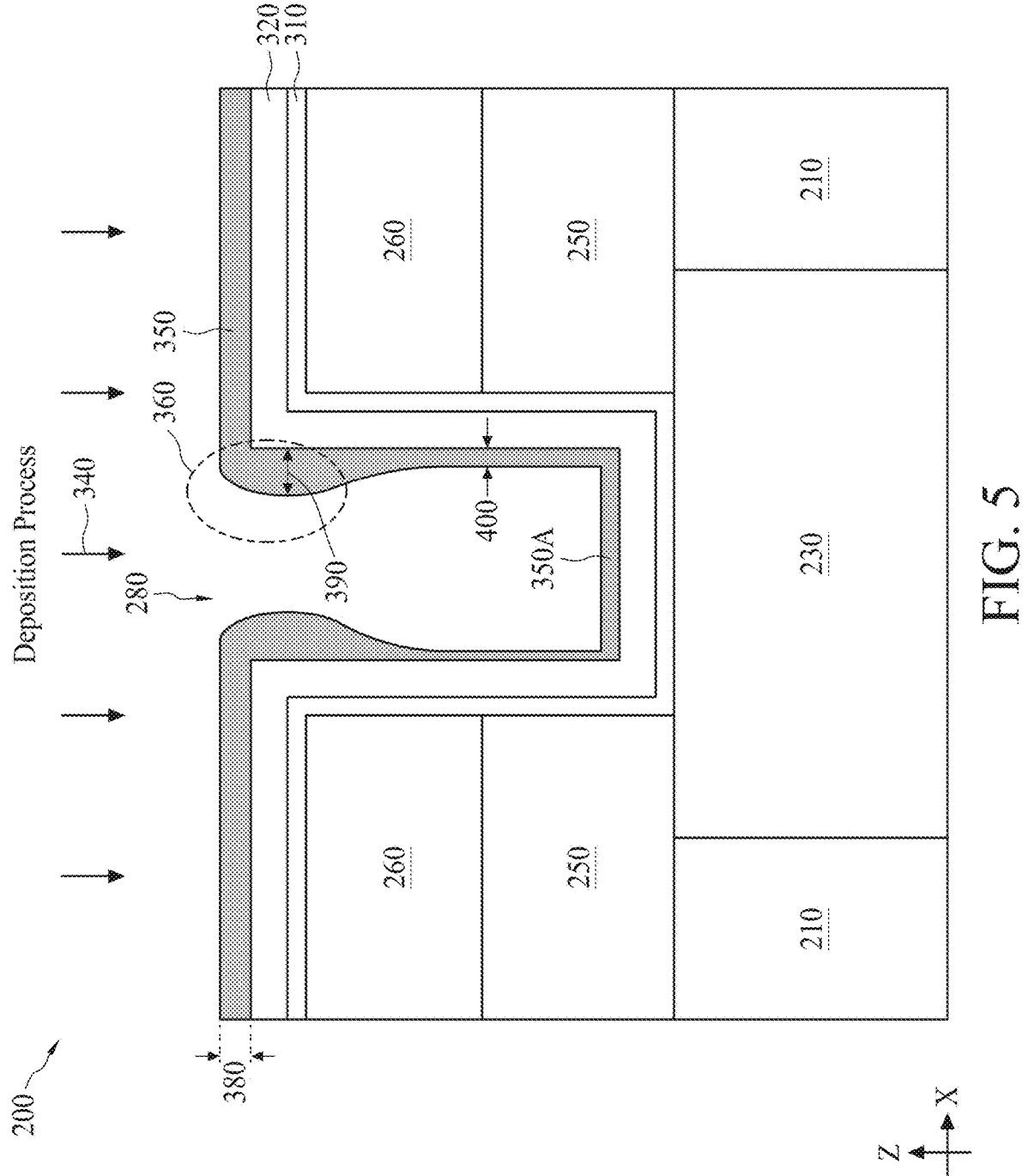

Referring now to FIG. 5, a deposition process 340 is performed to the IC device 200 to form a conductive layer 350 over the glue layer 320. The deposition process 340 may include a PVD process or a CVD process. Regardless of the specific type of deposition technique used, the deposition process 340 is carefully configured to form an overhang portion 360 as a part of the conductive layer 350 formed partially in the opening 280. As example, about 4 torr of pressure and less than about 500 Watts of power may be used in a PVD process. For CVD process, about 4 torr of pressure and above 500 Watts of power may be used in the formation of the overhang. The overhang portion 360 is an inherent result of the deposition process 340 being performed according to the above process parameters.

For example, portions of the conductive layer 350 may be deposited on the upper segments of the sidewalls of the opening 280 (i.e., on upper segments of the side surfaces of the glue layer 320) at a substantially faster rate than portions of the conductive layer 350 deposited on the lower segments of the sidewalls of the opening 280. As a result, the opening 280 at the top is more laterally restricted (e.g., by the presence of the overhang portion 360) than the bottom of the opening 280. Alternatively stated, the exposed side surface of the overhang portion 360 has a gradient profile, such that it is tapered in the X-direction towards the glue layer 320 as the depth in the Z-direction increases. Forming such an overhang portion 360 is one of the unique aspects of the present disclosure, as the overhang portion 360 helps block a treatment process (performed in a later fabrication step) from reaching a bottom portion 350A of the conductive layer 350 located within the opening 280. This will be discussed below in more detail.

As shown in FIG. 5, a portion of the conductive layer 350 formed on the upper surface of the glue layer 320 has a thickness 380 (measured in the Z-direction), the overhang portion 360 has a maximum lateral dimension 390 (measured in the X-direction), and a segment of the conductive layer 350 formed near a bottom portion of the sidewall of the opening 280 has a lateral dimension 400 (also measured in the X-direction). The thickness 380 and the maximum lateral dimension 390 are each greater than the lateral dimension 400. In some embodiments, the deposition process 340 is configured such that the thickness 380 is in a range between about 8 nanometers (nm) and about 15 nm, the maximum lateral dimension 390 is in a range between about 6 nanometers and about 13 nanometers, and the lateral dimension 400 is in a range between about 05 nanometers and about 10 nanometers.

The above ranges are not randomly chosen but rather specifically configured to ensure that the conductive layer 350 can achieve a suitable overhang portion 360 that is not too wide nor too narrow. If the overhang portion 360 is too wide, it may unduly restrict the size of the opening 280 at the top, such that the opening 280 may be completely sealed off by the overhang portion 360, or at least to the point where it is difficult to deposit any materials into the opening 280, which is supposed to occur in a later fabrication process. On the other hand, if the overhang portion 360 is too narrow, it may not adequately serve its intended function of blocking the treatment process (to be performed in a subsequent step) from reaching the bottom portion 350A of the conductive layer 350. Here, the overhang portion 360 is configured to have an optimized size and/or profile, such that it can still effectively block the treatment process from reaching the bottom portion 350A of the conductive layer 350, and yet it does not unduly restrict the opening 280 at the top. As such, a conductive material may still be freely deposited into the opening 280 to form the conductive via, as will be discussed below in more detail.

Figure 6:
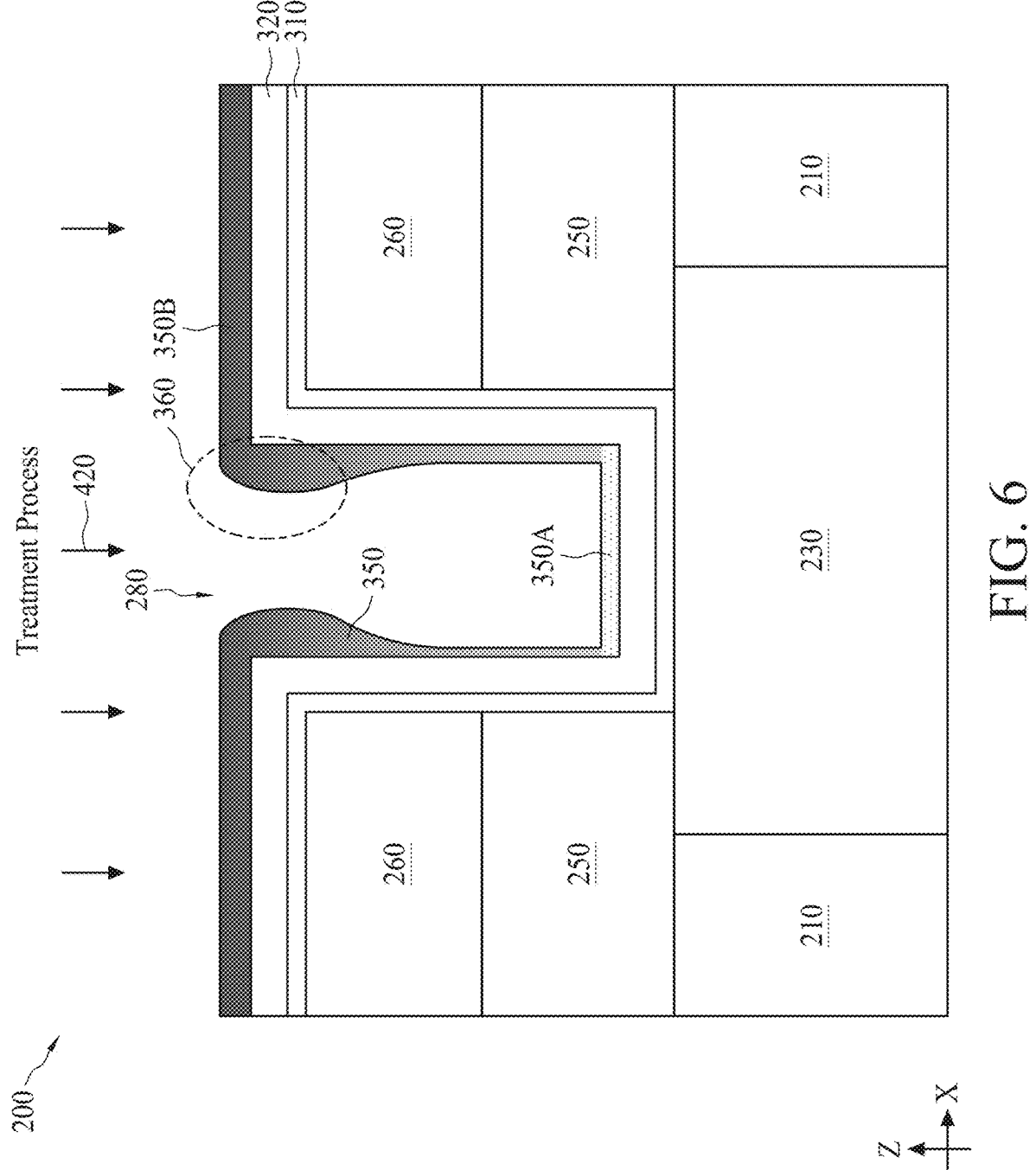

Referring now to FIG. 6, a treatment process 420 is performed to the IC device 200. The treatment process 420 introduces a non-metal material to a top portion 350B of the conductive layer 350. For example, the non-metal material may be introduced by nitriding or oxidizing the top portion 350B of the conductive layer. In some embodiments, the treatment process 420 includes a plasma treatment process, which may include applying a plasma that contains $N_2$, $NH_3$, $H_2$, $N_2O$, $O_2$, or $CO_2$ to the top portion 350B of the conductive layer 350.

As a result of the treatment process 420, nitrogen (N), oxygen (O), carbon (C), or hydrogen (H) may be introduced into the top portion 350B of the conductive layer 350. Since the overhang portion 360 is also a part of the top portion 350B, the treatment process 420 also introduces the non-metal material, such as N, O, C, or H, to the overhang portion 360. Since the treatment process 420 is performed from above the IC device 200, the distribution of the non-metal material within the overhang portion 360 may have a gradient profile. For example, the concentration level of the non-metal material (be it N, 0, C, or H) may increase towards the top surface of the overhang portion 360, and the concentration level may decrease the farther down it goes within the overhang portion 360. In this manner, the concentration level of the non-metal material within the overhang portion 360 varies as a function of depth: the concentration level decreases as the depth increases.

As the overhang portion 360 protrudes laterally outwards, it serves as a blocking component to substantially prevent the plasma of the treatment process 420 from reaching the bottom portion 350A of the conductive layer 350. Therefore, the bottom portion 350A of the conductive layer 350 is mostly free of the non-metal material. In some cases, even if some amount of plasma gets past the overhang portion 360 and reaches the bottom portion 350A, it may be negligible and/or substantially undetectable. The difference between the non-metal material content levels between the bottom portion 350A and the overhang portion 360, as well as the gradient distribution of the non-metal material content within the overhang portion 360, are also inherent results of the particular fabrication processes 340 and 420 being performed according to embodiments of the present disclosure. In addition, these inherent results are unique physical characteristics of devices fabricated according to embodiments of the present disclosure.

In some embodiments, the treatment process 420 is performed with a process power between about 50 watts and about 500 watts, with a process pressure between about 4 torrs and about 50 torrs, and with a process temperature between about 200 degrees Celsius and about 400 degrees Celsius. These process parameters are not randomly chosen but specifically configured to ensure that the non-metal material is introduced to the overhang portion 360, but not to the bottom portion 350A of the conductive layer 350. For example, the above ranges allow the plasma bombardment of the treatment process 420 to be strong enough to penetrate the surface of the overhang portion 360 and get inside the overhang portion, but not too strong to risk reaching the bottom portion 350A.

Figure 7:
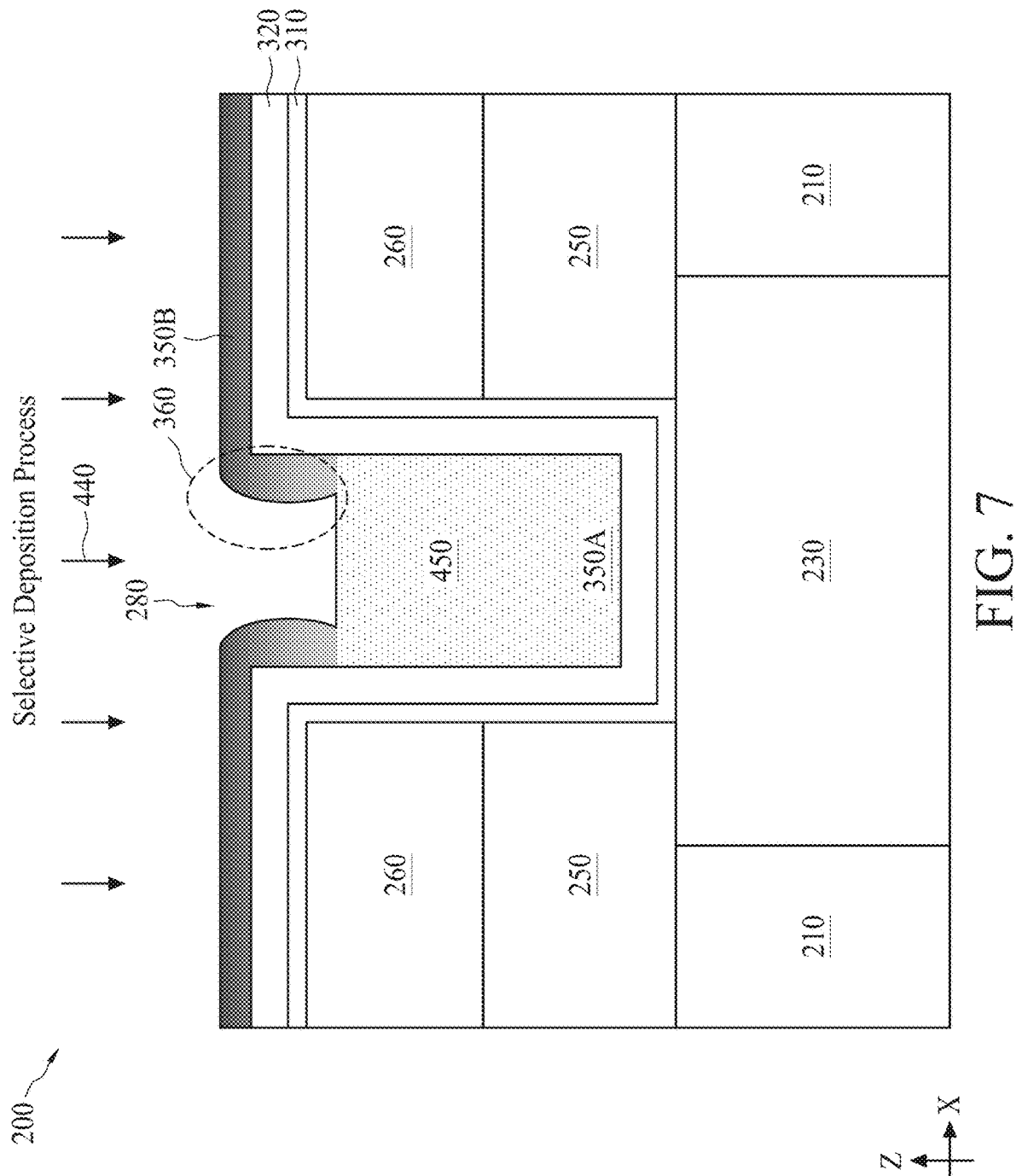

Referring now to FIG. 7, a selective deposition process 440 is performed to the IC device 200. The selective deposition process 440 may include a CVD process in some embodiments, or an ALD process in some other embodiments. In some embodiments, the selective deposition process 440 and the deposition process 340 may be performed in a same chamber. In some embodiments, the treatment process 420 may also be performed in the same chamber in which the selective deposition process 440 and the deposition process 340 are performed.

The selective deposition process 440 deposits a conductive layer 450 in the opening 280 without trapping air gaps or seams therein. In more detail, as discussed above with reference to FIG. 6, the treatment process 420 has introduced the non-metal material into the top portion 350B of the conductive layer 350. The non-metal material content within the top portion 350B (including the overhang portion 360) suppresses a reaction with the precursors used in the selective deposition process 440. Meanwhile, the bottom portion 350A of the conductive layer 350 still reacts well with the precursors used in the selective deposition process 440. In some embodiments, the precursors used in the selective deposition process 440 include $WF_6+H_2$, which reacts well with the tungsten (or other types of metal materials) of the bottom portion 350A of the conductive layer 350. Accordingly, the conductive layer 450 (containing tungsten in this case) may be steadily deposited on the bottom portion 350A to fill the opening 280 from the bottom toward the top. However, since the precursors $WF_6+H_2$ do not react well with the non-metal-containing overhang portion 360 or the rest of the top portion 350B of the conductive layer, very little (if any) of the conductive layer 450 is directly deposited on the surfaces of the overhang portion 360 or on the upper surfaces of the top portion 350B. The lack of direct deposition of the conductive layer 450 on the overhang portion 360 is beneficial, since it allows the opening 280 to stay unrestricted, which in turn allows the conductive layer 450 to be more easily deposited on the bottom portion 350A within the opening 280 without pinching off the opening 280.

Again, this is an inherent result of the non-metal materials having been introduced to the overhang portion 360 by the treatment process 420. Without such a treatment process 420, the overhang portion 360 would not have been able to suppress the reaction with the precursors of the selective deposition process 440. As a result, the conductive layer 450 would have been directly deposited onto the side surfaces of the overhang portion 360, which could quickly choke off the opening 280 before the opening 280 is fully filled. Had a via been formed in the opening 280 in that manner, the air gap trapped in the opening 280 would have contributed to a high parasitic resistance of the via, which could degrade device performance such as speed or power consumption.

If the overhang portion 360 had not been formed, the treatment process 420 alone would not have been able to achieve the intended benefits either. For example, in the absence of the overhang portion 360, the treatment process 420 would be able to reach a substantial portion of the bottom portion 350A of the conductive layer 350. As such, non-metal materials would have been introduced to the bottom portion 350A, which would have made the deposition of the conductive layer 450 within the opening 280 difficult, since the bottom portion 350A would have suppressed the reaction with the precursors of the selective deposition process 440 as well. Meanwhile, in conventional processes where the overhang portion 360 is not formed, and the treatment process 420 is not performed either, the problem is that the gap filling performance of existing deposition techniques is still unable to fully fill the opening 280 without trapping air gaps or seams within any via formed in the opening 280, due to the small sizes of the opening 280.

In contrast, the present disclosure utilizes both the overhang portion 360 and the treatment process 420 to effectively block the deposition of a conductive material in places other than the bottom portion 350A. In other words, the unique combination of the formation of the overhang portion 360 and the subsequently performed treatment process 420 facilitate the selective deposition of the conductive layer 450 within the opening 280, which helps the via formed as a result to be substantially free of any air gaps, voids, or seams.

In some embodiments, the types of materials used for the conductive layer 450 may be different than the types of materials used for the conductive layer 350. For example, the conductive layer 350 may be configured to have a material composition that allows the treatment process 420 to easily introduce the non-metal material to the conductive layer 350, while the conductive layer 450 may be configured to have a material composition that allows it to be more selectively deposited on a metal material (e.g., the bottom portion 350A) but not on a metal material that also contains a non-metal material (e.g., the overhang portion 360). In other embodiments, the conductive layers 350 and 450 may be configured to have the same material composition for the sake of simplicity.

Figure 8:
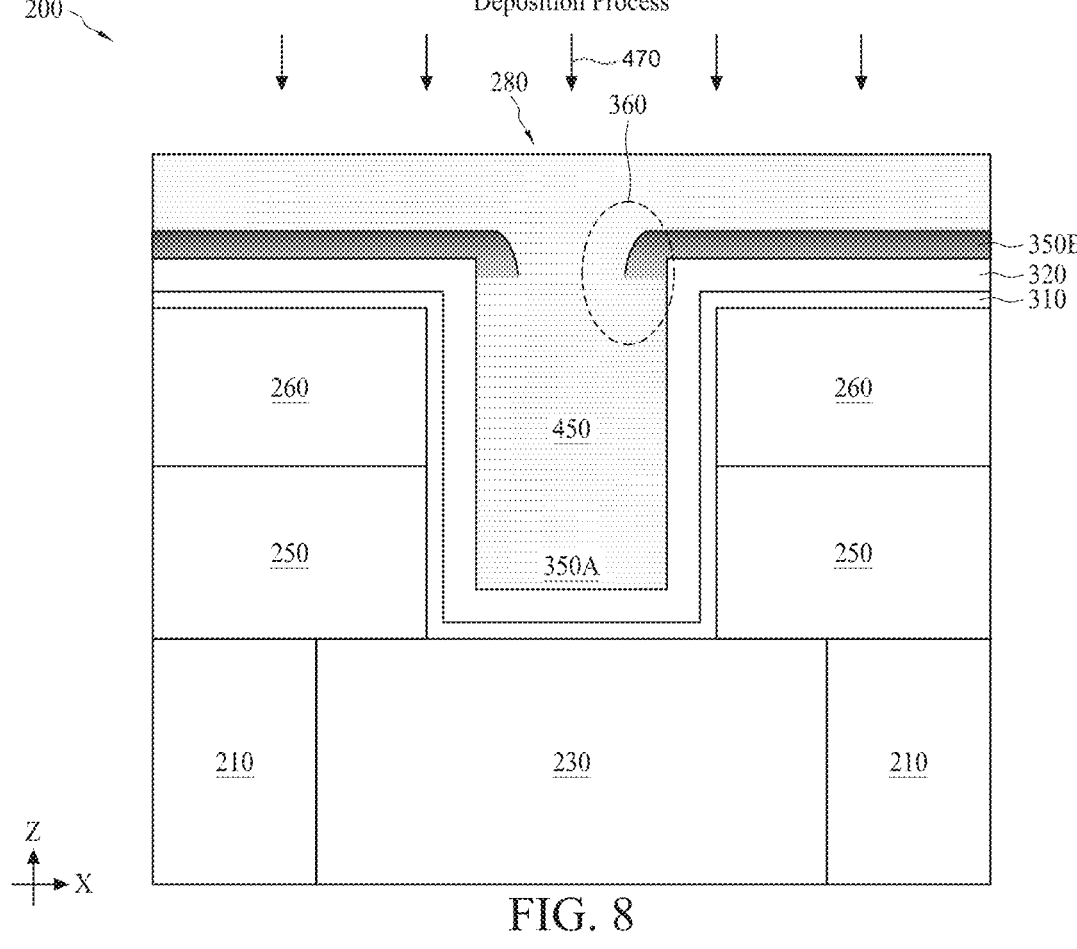

Referring now to FIG. 8, a deposition process 470 is performed to the IC device 200 to continue the deposition of the conductive layer 450 in the opening 280. The conductive layer 450 completely fills the opening 280 and is also deposited on the upper surface of the top portion 350B of the conductive layer 350 (including the overhang portions 360) outside the opening 280. In some embodiments, the deposition process 470 may include a CVD process, and it may be performed within the same chamber in which the selective deposition process 440 is performed. However, the deposition process 470 may be performed with a substantially faster flow rate than the selective deposition process 440, and/or with a substantially greater process power than the selective deposition process 440. Due to the faster flow rate and/or the greater process power, the deposition process 470 can quickly fill the opening 280. Since the opening 280 has already been mostly filled before the deposition process 470 is performed, a ratio of the height and the width of the unfilled opening 280 is already substantially reduced prior to the performance of the deposition process 470, meaning that the gap filling performance of the deposition process 470 is not as important (which allows the faster flow rate and/or the greater power). As such, it is more desirable to utilize the faster flow rate and/or the greater process power to achieve a faster fabrication process time. It is understood that the deposition process 470 may also be combined with the selective deposition process 440 in other embodiments. In other words, the selective deposition process 440 may be performed to completely fill the opening 280 with the conductive layer 450.

Figure 9:
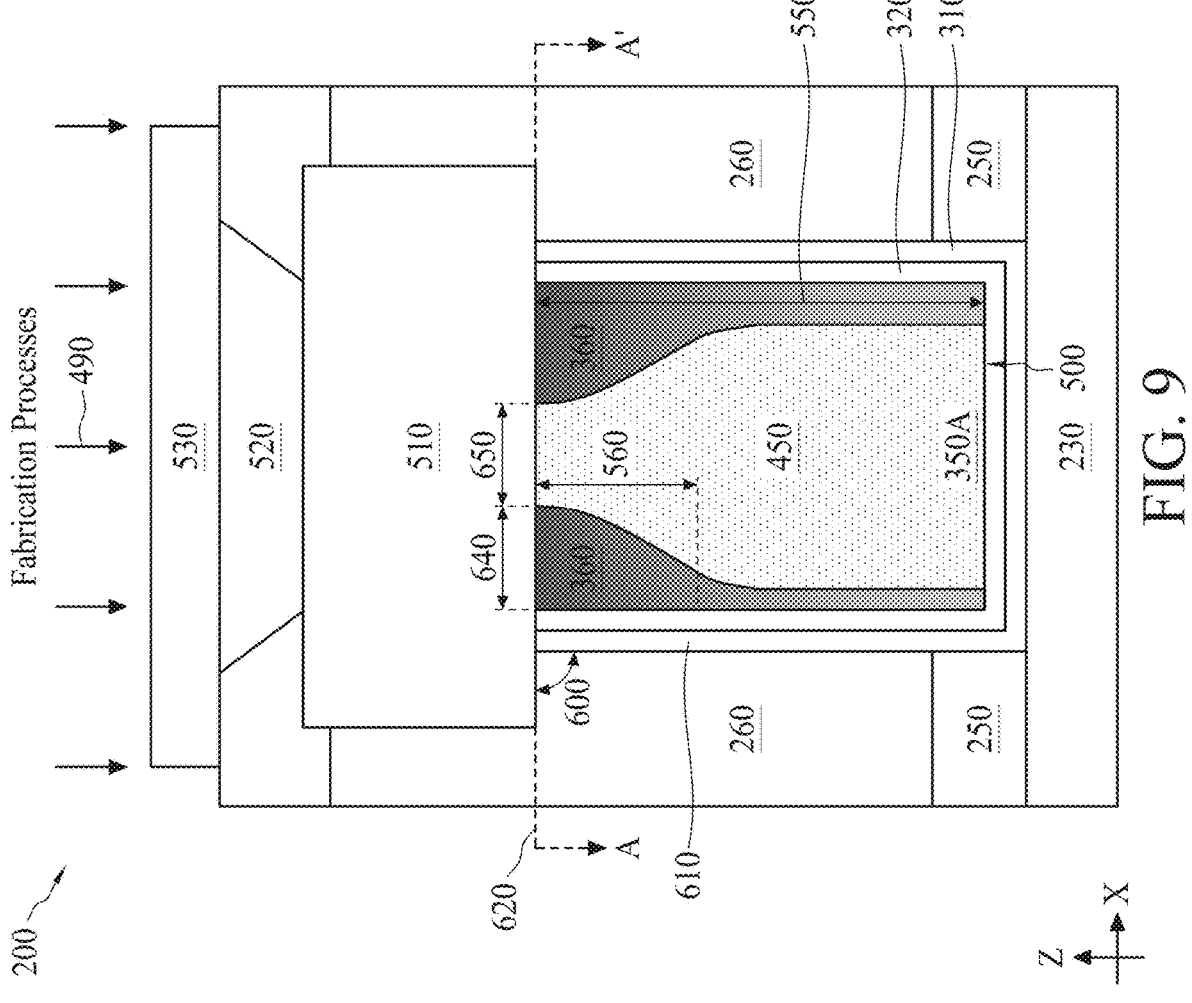

Referring now to FIG. 9, a plurality of additional fabrication processes 490 are performed to the IC device 200. One of the additional fabrication processes 490 includes a planarization process, for example, a chemical mechanical polishing (CMP) process. The planarization process may remove portions of the various layers outside the opening 280, including the top portion 350B of the conductive layer 350, portions of the conductive layer 450, portions of the glue layer 320, and portions of the barrier layer 310. The planarization process may be performed until the upper surfaces of the layer 260 are reached, that is, until the upper surfaces of the overhang portion 360 and the conductive layer 450 are substantially co-planar with the upper surface of the layer 260. Additional dielectric layer(s) may also be formed over the layer 260. For reasons of simplicity, they may also be labeled as the layer 260 herein. At this point, a conductive bottom via 500 may be formed collectively by the various conductive materials within the opening 280, including the bottom portion 350A, the conductive layer 450, and the overhang portion 360A disposed over the conductive layer 450.

The additional fabrication processes 490 may also include processes to form a circuit 510. The circuit 510 is embedded in the IC device 200 and may include a memory cell in some embodiments. For example, the circuit 510 may include a magnetoresistive random-access memory (MRAM) device, a resistive random access memory (RRAM) device, a conductive-bridging random access memory (CBRAM) device, a phase change memory (PCM) device, or another suitable embedded memory device. In that regard, a MRAM device is a type of non-volatile random access memory that stores data in a magnetic domain via magnetic storage elements separated by an insulating layer. These magnetic storage elements may be formed from two ferromagnetic plates, and each of these ferromagnetic plates can hold a magnetization. Data may be read from a cell of the MRAM device may be done by measuring an electrical resistance of the cell. Data may be written to the cell by passing electrical current through the cell, which induces a magnetic field that can be picked up by a writable plate of the ferromagnetic plates. An RRAM device is another type of non-volatile random access memory that functions by changing the resistance across a dielectric solid-state material. An RRAM cell includes an insulating layer that is sandwiched between two metal electrodes, and it utilizes the formation and the rupture of conductive filaments corresponding to a low resistance state and a high resistance state, respectively, in the insulating layer between two the two metal electrodes. CBRAM devices involve one electrode providing ions that dissolve readily in an electrolyte material. A PCM device produces thermal energy by passing current through a heating element (e.g., TiN). This may quickly heat and quench a chalcogenide glass, make the glass amorphous, or hold the glass in its crystallization temperature range for a period of time, thereby switching it to a crystalline state. The details of the circuit 510 are not illustrated herein for reasons of simplicity, but it is understood that the circuit 510 is electrically coupled to the conductive bottom via 500.

The additional fabrication processes 490 may also include processes to form a conductive top via 520 over the circuit 510. The conductive top via 520 may be formed by etching an opening (e.g., a via hole) through a dielectric structure (e.g., through the additional dielectric materials formed over the layer 260 and the via 500) and subsequently filling the opening with a conductive material, such as tungsten, titanium, cobalt, copper, ruthenium, aluminum, or combinations thereof. It is understood that the conductive top via 520 is electrically connected to one or more components of the circuit 510 from its top side, and the conductive bottom via 500 is electrically connected to one or more components of the circuit 510 from its bottom side. The conductive bottom via 500 also electrically couples the circuit 510 to the conductive component 230, which itself may be electrically coupled to other microelectronic components of the IC device 200. Thus, electrical access to the circuit 510 may be gained through the conductive top via 520 and the conductive bottom via 500.

The additional fabrication processes 490 may also include processes to form additional device structures 530 over the conductive top via 520. These additional device structures 530 may include other metallization components of a multilayer interconnect structure or other circuit components.

As shown in FIG. 9, the conductive bottom via 500 includes a substantially metallic segment that comprises the bottom portion 350A and the conductive layer 450. This substantially metallic segment may include a metal or a metal compound, such as W, Mo, Ru, Ti, or TiN, or combinations thereof. The conductive bottom via 500 also includes a segment comprised of the overhang portion 360, which has a material composition that includes metal and a non-metal material such as N, O, C, or H. The overhang portion 360 is disposed vertically over (or above) the conductive layer 450. The overhang portion 360 also laterally surrounds an upper portion, but not a lower portion, of the conductive layer 450. For example, the conductive bottom via 500 may have a vertical dimension 550 measured from a top surface of the conductive layer 450 to a bottom surface of the barrier layer 310 in the Z-direction. Meanwhile, the overhang portion 360 has a vertical dimension 560 measured from a top surface of the overhang portion 360 to a bottom tip of the overhang portion 360. The vertical dimensions 550 and 560 may also be referred to as a depth of the via 500 and a depth of the overhang portion 360, respectively. Since the overhang portion 360 laterally surrounds just an upper portion (but not all) of the conductive layer 450, the vertical dimension 560 is substantially smaller than the vertical dimension 550. In some embodiments, a ratio between the vertical dimension 560 and the vertical dimension 550 is less than about ⅓. Had this ratio been greater than ⅓, that would have corresponded to a scenario where the overhang portion 360 is too wide, which could cause it to inadvertently seal off the opening 280 before it was filled.

The present disclosure also configures the overall geometric shape of the via 500, such that it has a via angle 600 that is in a predefined range. In more detail, the via angle 600 is defined by an outer sidewall 610 of the via 500 (corresponding to a side surface of the barrier layer 310) and a horizontal plane 620 extending in the X-direction. The horizontal plane 620 may be a plane that coincides with a topmost surface of the via 500. The geometric shape—including the via angle 600—of the via 500 may be configured by tuning the etching process parameters of the etching process 270 discussed above with reference to FIG. 3.

In some embodiments, the via angle 600 is carefully tuned to be in a range between about 85 degrees and about 90 degrees. Such a range is beneficial, since it facilitates the formation of the overhang portion 360. Had the via angle 600 been smaller than about 85 degrees, it would have led to a trapezoidal shape (e.g., narrower at the top and wider at the bottom) for the via 500. The smaller via hole at the top as a result of such a trapezoidal shape could cause the overhang portion 360 to seal off the via hole too quickly (e.g., before the via hole is fully filled), which is undesirable. On the other hand, had the via angle 600 been larger than about 90 degrees, it would have led to an inverse or upside-down trapezoidal shape (e.g., wider at the top and narrower at the bottom) for the via 500. The larger via hole at the top as a result of such an inverse trapezoidal shape could have made it difficult to form the overhang portion 360. Even if the overhang portion 360 is formed, it may not be wide enough to block the plasma from the treatment process 420 from reaching the bottom portion 350A of the conductive layer 350. When that happens, the selective deposition process 440 could have been disrupted, since any non-metal material introduced to the bottom portion 350A may suppress the reaction with the precursors of the selective deposition process 440, which means that the selective deposition within the via hole would have been difficult. Here, the carefully tuned range for the via angle 600 allows the overhang portion 360 to easily form to the point where it is large enough to prevent the treatment process 420 from reaching the bottom portion 350A within the via hole, but not too large that it will pinch off the via hole.

As shown in FIG. 9, an upper surface of the overhang portion 360 has a lateral dimension 640 (measured in the X-direction), and an upper surface of the conductive layer 450 has a lateral dimension 650 (also measured in the X-direction). In some embodiments, a ratio between the lateral dimension 640 and the lateral dimension 650 is in a range between about 0.1:1 and about 0.5:1. Such a range is not random chosen, but rather an inherent result of the unique fabrication process flow discussed above. For example, the deposition process 340 is configured to achieve an optimized profile for the overhang portion 360, such that the overhang portion 360 is sufficiently large to substantially block the plasma from the treatment process 420 from reaching the bottom portion 350A of the conductive layer 350, but not too large to risk inadvertently sealing off the via hole, or at least interfere with the selective deposition of the conductive layer 450 subsequently (since it would have been more difficult to deposit through an unduly narrow via hole). The size of such an optimized overhang portion 360 is reflected in the ratio between the lateral dimension 640 and the lateral dimension 650. In other words, had such a ratio been too small, then the overhang portion 360 would not have been able to sufficiently prevent the introduction of the non-metal materials (from the treatment process 420) into the bottom portion 350A. On the other hand, had such a ratio been too large, then that could risk inadvertently sealing off the via hole, or interfere with the deposition of the conductive layer 450 into an unduly narrow via hole.

It is understood that although FIGS. 2-9 correspond to the X-cut cross-sectional side views of the IC device 200, the Y-cut cross-sectional side views of the IC device 200 may look similar to the X-cut views, at least with respect to the structural configuration of the via 500. For example, in the Y-cut cross-sectional side view, the via 500 may also include the conductive layer 450 (having a metal material composition) and the overhang portion 360 (having a material composition that includes metal and a non-metal material), where the overhang portion 360 is disposed over, and laterally surrounds, the conductive layer 450, similar to what is shown in the X-cut cross-sectional side view of FIG. 9.

To further facilitate the understanding of the present disclosure, a planar top view of the via 500 is illustrated in FIG. 10. For example, the planar top view is taken along the horizontal plane 620 of FIG. 9 (corresponding to a cutline A-A'), which is defined by both the X-direction and the Y-direction. As such, the planar top view of FIG. 10 illustrates both the X-direction and the Y-direction. The cutline A-A' is also shown in FIG. 10 to delineate the corresponding locations between the X-cut cross-sectional side view of FIG. 9 and the planar top view of FIG. 10.

As shown in FIG. 10, the via 500 manifests itself as having an inner rounded component and an outer rounded component that encircles the inner rounded component. The inner rounded component corresponds to the topmost surface of the conductive layer 450, and the outer rounded component corresponds to the topmost surface of the overhang portion 360. As discussed above, the conductive layer 450 has a metal composition that includes W, Mo, Ru, Ti, or TiN, and the overhang portion 360 has a composition that includes both a metal material and a non-metal material, where the metal material may be W, Mo, Ru, Ti, or TiN, and where the non-metal material includes N, O, C, or H. Note that the lateral dimension 640 of the overhang portion 360 reflects the size of the overhang portion 360 on one side (e.g., either the left side or the right side) of the conductive layer 450. It is understood that although conductive layer 450 and the overhang portion 360 are each illustrated as having substantially rounded upper surfaces in FIG. 10, they may assume other arbitrary shapes in alternative embodiments.

Referring now to FIG. 11, a simplified cross-sectional side of a three-dimensional integrated circuit (3DIC) 700 is illustrated as an embodiment of the IC device 200. Stated differently, the structures of the IC device 200 discussed above may be implemented in the 3DIC 700, and fabrication process flow discussed above may be performed as a part of the fabrication of the 3DIC 700. In the illustrated embodiment, the 3DIC 700 includes a plurality of IC chips that are interconnected together. For example, the 3DIC 700 includes memory chips 701 and 702. The memory chips 701-702 may include MRAM devices, RRAM devices, CBRAM devices, static random access memory (SRAM) devices, or other suitable memory devices. The 3DIC 700 may also include chips 710, 720, 730 (also referred to as chip-1, chip-2, and chip-3, respectively). These chips 710-730 may include logic circuitry or microcontrollers for controlling the operations of the memory chips 701-702. For example, the chips 710-730 may contain drivers, microcontrollers, registers, multiplexors, amplifiers, processing units, etc. It is understood that the circuit 510 and the via 500 discussed above may be embedded in any one of the chips 710-730, or in the memory chips 701-702, or even at an interface between these chips, for example, between the chips 710 and 720.

The 3DIC 700 also includes an E-die 750 and a P-die 760. The E-die 750 may refer to an electrical die that is configured to allow electrical testing or probing of the 3DIC 700. The P-die 760 may refer to a passivation die that isolates or insulates the heat generated from high voltages applied during the fabrication and/or operation of the 3DIC 700. In some embodiments, the via 500 discussed above may be formed within the E-die 750 or within the P-die 760 as well. The 3DIC 700 further includes a packaging substrate 780 and an interconnect structure 790 that electrically couples the packaging substrate 780 to the chips 701-702, 710-730, and the E-die 750 and P-die 760. The packaging substrate 780 provides mechanical support for the 3DIC 700, and it also contains circuitry for electrically interacting or controlling the microelectronic components of the chips 701-702, 710-730, and the E-die 750 and P-die 760. The interconnect structure 790 may include a plurality of interconnect layers that include metallization features such as metal lines and conductive vias. The vias of the interconnect structure 790 may also be formed using the unique fabrication process flow discussed above. For example, a via 810 of the interconnect structure 790 may be formed using the fabrication process flow discussed above such that it does not have air seams or gaps trapped within.

The 3DIC 700 may further include a plurality of conductive bumps 800 or other bonding components that could bond the chips 701-702, 710-730, and the E-die 750 and P-die 760 to the interconnect structure 790, as well as bonding the interconnect structure 790 to the packaging substrate 780. These conductive bumps 800 at the bottom of the packaging substrate 780 may also be used to attach the 3DIC 700 to another device, such as a printed circuit board. Electrical access to the various microelectronic components within the 3DIC 700 may be gained at least in part through the conductive bumps.

It is understood that although the discussions above mostly pertain to forming a via in the context of a 3DIC, the unique fabrication process flow herein may apply to conductive vias or contacts formed in other contexts as well. For example, the above process flow may be utilized to form a gate contact for a gate of a transistor, a source/drain contact for a source/drain of a transistor, or a via that electrically interconnects two metal lines of adjacent metal layers (e.g., a metal-1 layer and a metal-2 layer) of a multilayer interconnect structure.

Figures 12A, 12B, 12C, 12D:
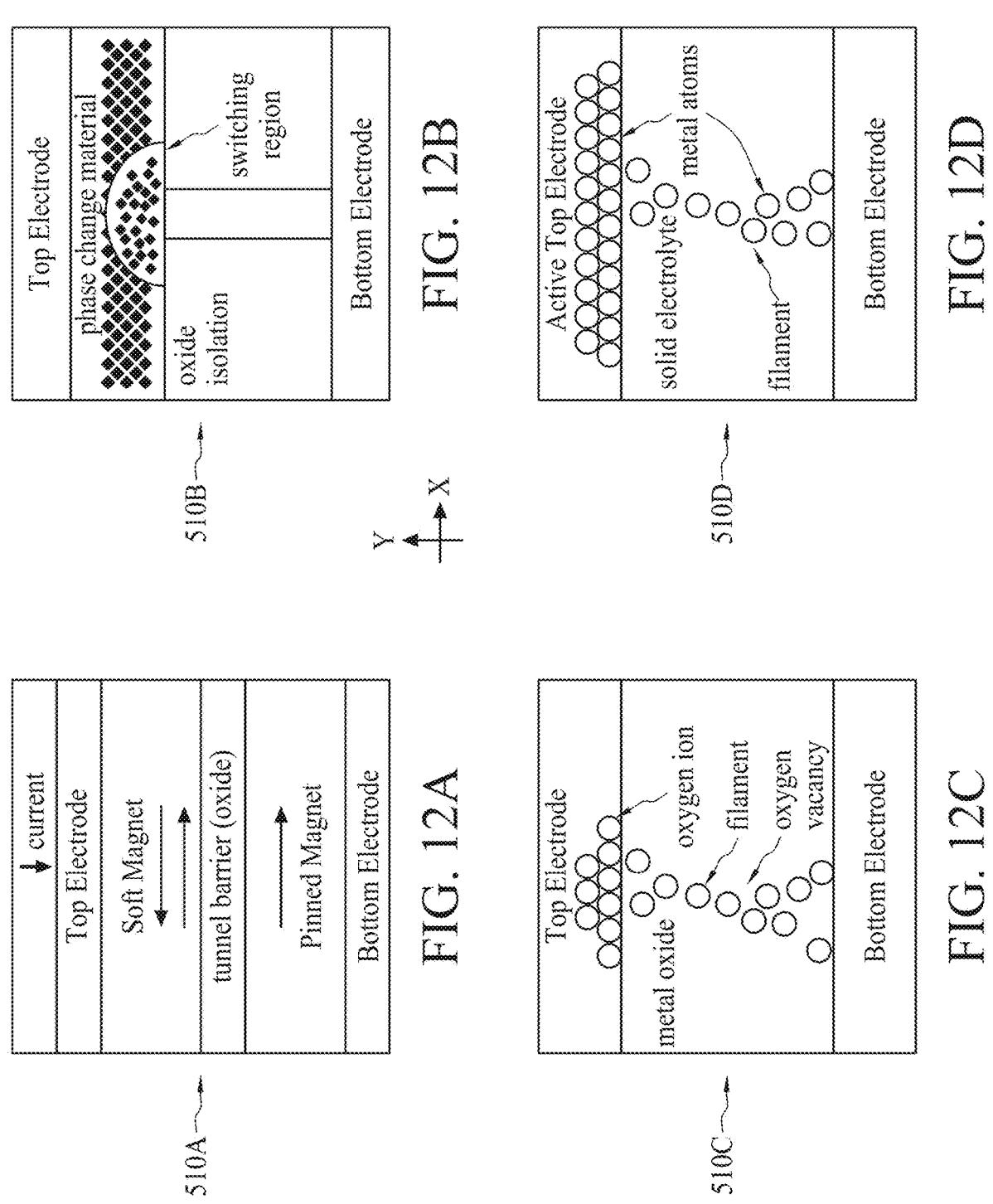
FIGS. 12A, 12B, 12C, and 12D illustrate cross-sectional views of various embodiments of a circuit according to various aspects of the present disclosure.
Figure 13:
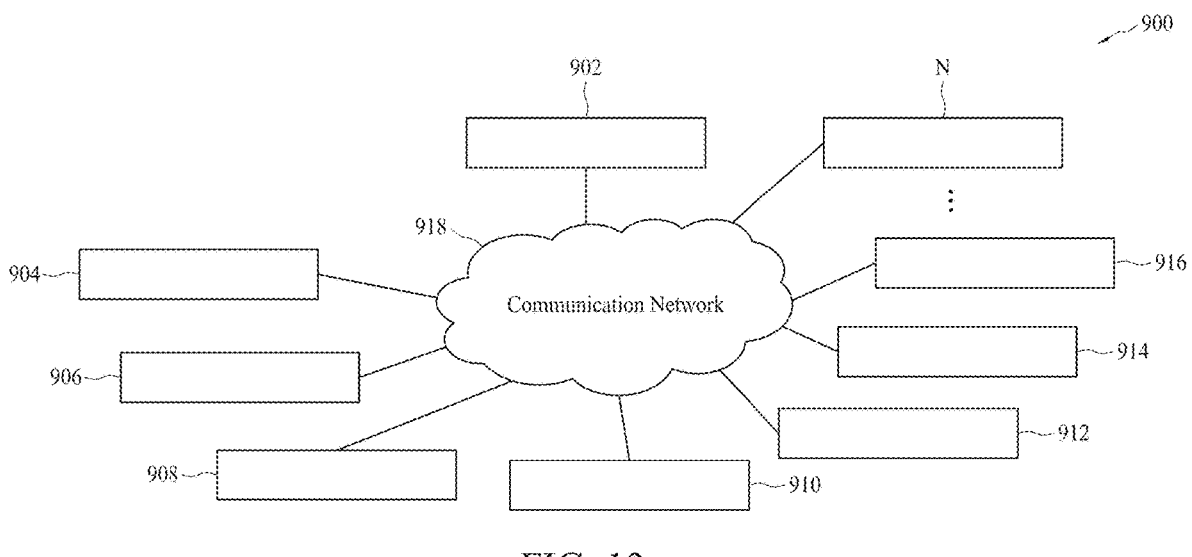
FIG. 13 illustrates an integrated circuit fabrication system according to various aspects of the present disclosure.

FIGS. 12A, 12B, 12C, and 12D illustrate cross-sectional views of various embodiments of the circuit 510 of FIG. 9 according to various aspects of the present disclosure. In more detail, FIG. 12A illustrates a Spin Torque Transfer Magnetic Random Access Memory (STT-MRAM) 510A (as a particular type of an MRAM device) that includes a tunnel barrier (oxide) disposed between a soft magnet and a pinned magnet. FIG. 12B illustrates a Phase Change Memory (PCM) 510B that includes a phase change material, an oxide isolation, and a switching region. FIG. 12C illustrates a Resistive switching Random Access Memory (RRAM) 510C that includes a filament material and oxygen vacancy in a metal oxide material. FIG. 12D illustrates a Conductive Bridge Random Access Memory (CBRAM) 510D that includes metal atoms and a filament in a solid electrolyte. For each of the memory devices 510A-510D, a top electrode is implemented at its top surface, and a bottom electrode is implemented at its bottom surface, to provide electrical access to these memory devices 510A-510D. The top electrode may be an embodiment of the via 520 of FIG. 9, and the bottom electrode may be an embodiment of the via 500 of FIG. 9. Note that oxygen ions are also located in the top electrode of the RRAM 510C of FIG. 12C, and that metal atoms are also located in the active top electrode of the CBRAM 510D of FIG. 12D. Regardless of the structural configuration and/or the electrical operations of the devices 510A-510D, it is understood that they may each be implemented as an embodiment of the circuit 510 and embedded in the 3DIC 700 of FIG. 11, and that the via 500 of the present disclosure may be formed as an embodiment of the bottom electrode to provide electrical connectivity to these devices 510A-510D.

FIG. 13 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such the processing tools to perform the various deposition processes discussed above; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 14 is a flowchart illustrating a method 1000 of fabricating a semiconductor device. The method 1000 includes a step 1010 to form a dielectric structure over a layer than contains a conductive component.

The method 1000 includes a step 1020 to form an opening in the dielectric structure. The opening exposes an upper surface of the conductive component.

The method 1000 includes a step 1030 to perform a first deposition process that deposits a first conductive layer over the dielectric structure and partially in the opening.

The method 1000 includes a step 1040 to perform a treatment process on a first portion of the first conductive layer formed over the dielectric structure. The treatment process introduces a non-metal material to the first portion of the first conductive layer.

The method 1000 includes a step 1050 to performing a second deposition process that at least partially fills the opening with a second conductive layer without trapping a gap therein.

In some embodiments, a second portion of the first conductive layer deposited on sidewalls of the opening has a gradient profile in a cross-sectional view. In some embodiments, the second portion of the first conductive layer protrudes more laterally as a distance from the conductive component increases. In some embodiments, the second portion of the first conductive layer also has the non-metal material introduced therein. In some embodiments, a concentration level of the non-metal material varies as a function of depth.

In some embodiments, the treatment process includes a plasma treatment process that uses $N_2$, $NH_3$, $H_2$, $N_2O$, $O_2$, or $CO_2$.

In some embodiments, the treatment process is performed using a process power in a range between about 50 watts and about 500 watts, with a process pressure between about 4 torrs and about 50 torrs, and a process temperature between about 200 degrees Celsius and about 400 degrees Celsius.

In some embodiments, the second deposition process deposits the second conductive layer at a faster rate on a second portion of the first conductive layer within the opening than on the first portion of the first conductive layer.

In some embodiments, the second deposition process is performed such that the second conductive layer does not completely fill the opening, and wherein the method further comprises performing a third deposition process that completely fills the opening with a third conductive layer. In some embodiments, the third deposition process is performed with a faster flow rate or a greater power level than the second deposition process. In some embodiments, the first deposition process, the second deposition process, and the third deposition process are performed such that: the first conductive layer and the second conductive layer have different material compositions; and the second conductive layer and the third conductive layer have a same material composition.

In some embodiments, a via is formed by the first conductive layer and the second conductive layer located in the opening, and wherein the method further comprises: forming a memory cell over the via.

It is understood that additional steps may be performed before, during, or after the steps 1010-1050. For example, in some embodiments, the method 1000 may further include a step of forming a glue layer before the first deposition process is performed. The glue layer is formed over an exposed upper surface of the conductive component, over an upper surface of the dielectric structure, and on sidewalls of the dielectric structure that define the opening. As another example, the method 1000 may include a step of forming a barrier layer over the glue layer. The first conductive layer is deposited on the barrier layer. As yet another example, the method 1000 may further include a step of forming a memory cell over the via.

Based on the above discussions, it can be seen that the present disclosure implements a unique fabrication process flow to form a via that is free of air seams, gaps, or voids. First, a deposition process is configured to deposit a conductive layer with an overhang profile (e.g., laterally protruding) at the top portion of a via hole. A treatment process (e.g., a plasma process) is then performed to introduce a non-metal material to the overhang portion, but not to the rest of the conductive layer at the bottom of the via hole, since the overhang portion substantially blocks the treatment from reaching the conductive layer at the bottom of the via hole. A selective deposition process is then performed to fill the via hole with a conductive material.

The unique fabrication process flow and the resulting IC device structure of the present disclosure offers advantages over conventional devices. It is understood, however, that no particular advantage is required, other embodiments may offer different advantages, and that not all advantages are necessarily disclosed herein. One advantage is the improved device performance. As discussed above, the non-metal content of the treated overhang portion suppresses a reaction with the precursors of the selective deposition process. This means that the conductive material can be deposited easily on the conductive material within the via hole but not on the overhang portion. In this manner, the via hole can be gradually filled by the conductive material from the bottom toward the top, while any lateral growth of the conductive material at the top part of the via hole is minimal. Therefore, unlike vias formed by conventional processes, the via filling the via hole according to embodiments of the present disclosure is substantially free of air seams, gaps, or voids. This translates into a reduced parasitic resistance, which in turn improves device speed and/or power consumption. Other advantages may include ease of fabrication and compatibility with existing fabrication processes.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure pertains to a method of fabricating a device. A dielectric structure is formed over a layer than contains a conductive component. An opening is formed in the dielectric structure. The opening exposes an upper surface of the conductive component. A first deposition process is performed that deposits a first conductive layer over the dielectric structure and partially in the opening. A treatment process is performed on a first portion of the first conductive layer formed over the dielectric structure. The treatment process introduces a non-metal material to the first portion of the first conductive layer. After the treatment process has been performed, a second deposition process is performed that at least partially fills the opening with a second conductive layer without trapping a gap therein.

Another aspect of the present disclosure pertains to a device. The device includes a conductive component. The device includes a via that is disposed over the conductive component. The device also includes a circuit that is disposed over the via. The via includes a first portion and a second portion disposed over the first portion. The first portion contains a metal. The second portion contains the metal and a non-metal material. The second portion has a tapered profile in a cross-sectional side view such that a lateral dimension of the second portion increases as a depth within the via decreases.

Yet another aspect of the present disclosure pertains to a device. The device includes a memory cell that is embedded in a chip of a three-dimensional integrated circuit (3DIC). The device includes a metallization component in the chip. The device also includes a via that electrically interconnects the memory cell and the metallization component. In a planar top view: the via includes a first portion and a second portion that encircles the first portion; the first portion contains a metal material that is W, Mo, Ru, Ti, or TiN; and the second portion contains the metal material and a non-metal material that is N, O, C, or H.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
forming a dielectric structure over a layer that contains a conductive component;
forming an opening in the dielectric structure, wherein the opening exposes an upper surface of the conductive component;
performing a first deposition process that deposits a first conductive layer over the dielectric structure and partially in the opening;
performing a treatment process on a first portion of the first conductive layer formed over the dielectric structure, wherein the treatment process includes a plasma treatment process that uses $H_2$, $O_2$, or $CO_2$ and introduces a non-metal material to the first portion of the first conductive layer;
after the treatment process has been performed, performing a second deposition process that partially fills the opening with a second conductive layer without trapping a gap therein; and
performing a third deposition process that deposits a third conductive layer over the second conductive layer, wherein a portion of the third conductive layer protrudes into and fills a portion of the opening, and wherein the third deposition process is performed with a faster flow rate or a greater power level than the second deposition process.

2. The method of claim 1, wherein a second portion of the first conductive layer deposited on sidewalls of the opening has a gradient profile in a cross-sectional view.

3. The method of claim 2, wherein the second portion of the first conductive layer protrudes more laterally as a distance from the conductive component increases.

4. The method of claim 2, wherein:
the second portion of the first conductive layer also has the non-metal material introduced therein; and
a concentration level of the non-metal material varies as a function of depth.

5. The method of claim 1, wherein the treatment process is performed using a process power in a range between about 50 watts and about 500 watts, with a process pressure between about 4 torrs and about 50 torrs, and a process temperature between about 200 degrees Celsius and about 400 degrees Celsius.

6. The method of claim 1, wherein the second deposition process deposits the second conductive layer at a faster rate on a second portion of the first conductive layer within an opening than on the first portion of the first conductive layer.

7. The method of claim 1, wherein the first deposition process, the second deposition process, and the third deposition process are performed such that:
the first conductive layer and the second conductive layer have different material compositions; and
the second conductive layer and the third conductive layer have a same material composition.

8. The method of claim 1, further comprising, before the first deposition process is performed:
forming a glue layer over an exposed upper surface of the conductive component, over an upper surface of the dielectric structure, and on sidewalls of the dielectric structure that define the opening; and
forming a barrier layer over the glue layer, wherein the first conductive layer is deposited on the barrier layer.

9. The method of claim 1, wherein a via is formed by the first conductive layer and the second conductive layer located in the opening, and wherein the method further comprises: forming a memory cell over the via.

10. A method, comprising:
forming a dielectric structure over a conductive component in a cross-sectional side view;
etching an opening that extends vertically through the dielectric structure in the cross-sectional side view, wherein the opening exposes a portion of the conductive component;
forming a conductive layer that partially fills the opening, wherein a portion of the conductive layer disposed near an upper portion of the opening protrudes laterally in the cross-sectional side view;
introducing a non-metal material to at least the portion of the conductive layer that protrudes laterally, wherein the non-metal material is introduced via a plasma treatment process, and wherein $H_2$, $O_2$, or $CO_2$ is introduced as the non-metal material;
forming an additional conductive material partially in the opening after the non-metal material has been introduced; and
completely filling the opening with a further conductive material, wherein the further conductive material is formed at a faster rate than the additional conductive material.

11. The method of claim 10, wherein the additional conductive material is formed without trapping a void therein.

12. The method of claim 11, wherein a substantial majority of the additional conductive material is formed below the portion of the conductive layer that protrudes laterally.

13. A method, comprising:

forming a dielectric structure over a conductive component;

etching an opening in the dielectric structure, the opening exposing the conductive component;

performing a first deposition process, the first deposition process partially filling the opening with a first conductive layer that has an overhang in a cross-sectional side view;

performing a plasma treatment process that uses $H_2$, $O_2$, or $CO_2$, wherein the overhang of the first conductive layer substantially prevents the plasma treatment process from reaching a bottom portion of the first conductive layer;

after the plasma treatment process has been performed, performing a second deposition process that partially fills the opening with a second conductive layer; and performing a third deposition process that completely fills the opening with a third conductive layer, wherein the third deposition process is performed at a faster rate than the second deposition process.

14. The method of claim 13, wherein the plasma treatment process nitridizes or oxidizes at least a segment of a top portion of the first conductive layer, but the bottom portion of the first conductive layer remains substantially un-nitridized and un-oxidized after the plasma treatment process has been performed.

15. The method of claim 1, wherein:

a second portion of the first conductive layer deposited on sidewalls of the opening has a gradient profile in a cross-sectional view; and a concentration level of the non-metal material within the second portion of the first conductive layer varies as a function of depth.

16. The method of claim 1, wherein a second portion of the first conductive layer deposited on sidewalls of the opening has a gradient profile in a cross-sectional view, such that the second portion of the first conductive layer has a first maximum lateral dimension at a first distance from the conductive component and a second maximum lateral dimension at a second distance from the conductive component, wherein the first distance is greater than the second distance, and wherein the first maximum lateral dimension is greater than the second maximum lateral dimension.

17. The method of claim 1, wherein the third deposition process is performed such that portions of the third conductive layer are formed over the dielectric structure, and wherein the method further comprises performing a planarization process that removes the portions of the third conductive layer formed over the dielectric structure.

18. The method of claim 9, wherein the memory cell comprises a magnetoresistive random-access memory (MRAM) device, a resistive random access memory (RRAM) device, a conductive-bridging random access memory (CBRAM) device, or a phase change memory (PCM) device.

19. The method of claim 9, further comprising forming one or more metallization components of a multilayer interconnect structure over the memory cell.

20. The method of claim 13, wherein the third deposition process is performed such that portions of the third conductive layer are formed over the dielectric structure, and wherein the method further comprises:

performing a planarization process that removes the portions of the third conductive layer formed over the dielectric structure, wherein remaining portions of the third conductive layer, the second conductive layer, and the first conductive layer collectively form a via in the opening;

forming a memory cell over the via, wherein the memory cell comprises a magnetoresistive random-access memory (MRAM) device, a resistive random access memory (RRAM) device, a conductive-bridging random access memory (CBRAM) device, or a phase change memory (PCM) device; and forming one or more metallization components of a multilayer interconnect structure over the memory cell.

* * * * *